United States Patent
Young et al.

(10) Patent No.: US 8,760,060 B2
(45) Date of Patent: Jun. 24, 2014

(54) SOLID STATE LIGHT FIXTURE WITH ENHANCED THERMAL COOLING AND COLOR MIXING

(75) Inventors: Garrett J. Young, Sully, IA (US); Andrew Stangeland, Oskaloosa, IA (US)

(73) Assignee: Prism Projection, Inc., Sully, IA (US)

( * ) Notice: Subject to any disclaimer, the term of this patent is extended or adjusted under 35 U.S.C. 154(b) by 707 days.

(21) Appl. No.: 12/618,394

(22) Filed: Nov. 13, 2009

(65) Prior Publication Data

US 2011/0012512 A1 Jan. 20, 2011

Related U.S. Application Data

(60) Provisional application No. 61/226,205, filed on Jul. 16, 2009.

(51) Int. Cl.
*H05B 37/02* (2006.01)
*H01J 7/24* (2006.01)

(52) U.S. Cl.
USPC ........... 315/117; 315/363; 315/291; 345/589; 345/590; 345/690; 362/231

(58) Field of Classification Search
USPC .......... 345/589, 590, 600, 604, 690; 313/506, 313/509
See application file for complete search history.

(56) References Cited

U.S. PATENT DOCUMENTS

| | | | |
|---|---|---|---|
| 6,498,355 B1 | 12/2002 | Harrah et al. | |
| 7,884,964 B2 * | 2/2011 | Maltz et al. | 358/1.9 |
| 2005/0156103 A1 | 7/2005 | May et al. | |
| 2005/0258438 A1 | 11/2005 | Arik et al. | |
| 2007/0103646 A1 * | 5/2007 | Young | 353/52 |
| 2007/0139895 A1 | 6/2007 | Reis et al. | |

(Continued)

FOREIGN PATENT DOCUMENTS

| WO | WO-2007263393 A1 | 11/2007 |
|---|---|---|
| WO | WO 2008/128016 * | 4/2008 |

(Continued)

OTHER PUBLICATIONS

"CIE 1931 Color Space (from Wikipedia)", [online] Downloaded from the Internet at http://en.wikipedia.org/wiki/CIE_1931_color_space, (Downloaded on Jul. 14, 2009), 9 pgs.

(Continued)

*Primary Examiner* — Douglas W Owens
*Assistant Examiner* — Jonathan Cooper
(74) *Attorney, Agent, or Firm* — Schwegman, Lundberg & Woessner, P.A.

(57) ABSTRACT

Various system embodiments comprise a substrate of high thermal conductivity, a solid state light emitting device, an electric circuit, and an electric dielectric. The device has a die and a connection point to the die with a low thermal resistance. The connection point is in contact with the substrate. The electric circuit is electrically connected to the light emitting device, and separated from the substrate by the electrical dielectric. Various system embodiments comprise at least four color sources; and a controller configured to calculate a solution to form a target color using the color sources when the target is outside of a gamut formed by the color sources. The controller is configured to find an equivalent target color with reduced saturation.

37 Claims, 7 Drawing Sheets

(56) References Cited

U.S. PATENT DOCUMENTS

| | | | |
|---|---|---|---|
| 2007/0263379 | A1 | 11/2007 | Dowling |
| 2007/0263393 | A1 | 11/2007 | Van De |
| 2008/0002410 | A1 | 1/2008 | Burton et al. |
| 2008/0117637 | A1 | 5/2008 | Chang et al. |
| 2008/0170392 | A1 | 7/2008 | Speier et al. |
| 2008/0225520 | A1* | 9/2008 | Garbus ............... 362/231 |
| 2008/0239723 | A1 | 10/2008 | Lin |
| 2009/0046469 | A1 | 2/2009 | Yang et al. |
| 2009/0116232 | A1* | 5/2009 | Chang et al. ......... 362/231 |
| 2009/0122073 | A1* | 5/2009 | Higgins et al. ....... 345/590 |

FOREIGN PATENT DOCUMENTS

| | | | |
|---|---|---|---|
| WO | WO-2008117637 | A1 | 5/2008 |
| WO | WO-2008225520 | A1 | 9/2008 |
| WO | WO-2008128016 | A2 | 10/2008 |
| WO | WO-2008239723 | A1 | 10/2008 |
| WO | WO-2008142638 | A1 | 11/2008 |
| WO | WO-2011008278 | A1 | 1/2011 |

OTHER PUBLICATIONS

"Cieluv Color Space (from Wikipedia)", [online] Downloaded from the Internet at http://en.wikipedia.org/wiki/CIELUV_color_space, (Downloaded on Jul. 14, 2009), 3 pgs.

"International Application Serial No. PCT/US2010/01979, Search Report mailed Nov. 23, 2010", 6 pgs.

"International Application Serial No. PCT/US2010/01979, Written Opinion mailed Nov. 23, 2010", 7 pgs.

"Point in Triangle Test (Point in Polygon Tests)", [online] Downloaded from the Internet at http://www.blackpawn.com/texts/pointinpoly/default.html, (Downloaded on Jul. 14, 2009), 3 pgs.

"Solid State Light Fixture With Enhanced Thermal Cooling and Color Mixing", U.S. Appl. No. 61/226,205, filed Jul. 16, 2009.

Bourke, P, "Minimum Distance from a Point to a Line", [online] Downloaded from Internet at http://local.wasp.uwa.edu.au/~pbourke/geometry/pointline/, (1988), 4 pgs.

Bourke, Paul, "Intersection Point of Two Lines", [online] Downloaded from the Internet at http://local.wasp.uwa.edu.au/~pbourke/geometry/lineline2d/, (1989), 2 pgs.

Bourke, Paul, "Pivoting Matrices", [online] Downloaded from the Internet at http://local.wasp.uwa.edu.au/~pbourke/geometry/lineline2d/, (1989), 9 pgs.

Waner, S, et al., "The Simplex Method, Solving Standard Maximization Problems", Based on Section 4.3 in Finite Mathematics and Finite Mathematics and Applied Calculus, [online], Downloaded from the Internet at http://people.hofstra.edu/Stefan_waner/realworld/tutorialsf4/unit4_3.html, (1999), 8 pgs.

International Application Serial No. PCT/US2010/001979, International Preliminary Report on Patentablility mailed Jan. 26, 2012, 9 pgs.

"European Application Serial No. 10740028.5, Office Action mailed Mar. 27, 2013", 4 pgs.

* cited by examiner

SOLID STATE LIGHT FIXTURE WITH ENHANCED THERMAL COOLING AND COLOR MIXING

CROSS REFERENCE TO RELATED APPLICATIONS

This application claims the benefit of U.S. Provisional Application No. 61/226,205, filed on Jul. 16, 2009, under 35 U.S.C. §119(e), which is hereby incorporated by reference.

TECHNICAL FIELD

This application relates generally to illumination and display devices, and more particularly to illumination and display devices that thermally manage solid state light fixtures and combine more than three source colors.

BACKGROUND

Entertainment and architectural lighting has been dominated by incandescent and other conventional sources, which have well-known drawbacks. In recent years, solid-state illumination sources, especially light emitting diodes (LEDs), have been presented in order to solve many of these drawbacks. However, they have not been effectively utilized to their fullest potential. Although LEDs have long life and high luminous efficiency, these properties alone do not provide an adequate solution for the demanding applications of entertainment and architectural lighting.

The most common illumination and display devices use three source colors—red, green, and blue. The intensities of these source colors can be varied to produce different target colors. With three source colors there are well known methods for calculating the ratio of intensities that will produce a target color. Mixing more than three colors to form a target color is significantly more complex.

SUMMARY

Various system embodiments comprise a substrate of high thermal conductivity, a solid state light emitting device, an electric circuit, and an electric dielectric. The device has a die and a connection point to the die with a low thermal resistance. The connection point is in contact with the substrate. The electric circuit is electrically connected to the light emitting device, and separated from the substrate by the electrical dielectric.

Various system embodiments comprise at least four color sources, and a controller configured to calculate a solution to form a target color using the color sources when the target is outside of a gamut formed by the color sources. The controller is configured to find an equivalent target color with reduced saturation.

This Summary is an overview of some of the teachings of the present application and not intended to be an exclusive or exhaustive treatment of the present subject matter. Further details about the present subject matter are found in the detailed description and appended claims. Other aspects will be apparent to persons skilled in the art upon reading and understanding the following detailed description and viewing the drawings that form a part thereof, each of which are not to be taken in a limiting sense. The scope of the present invention is defined by the appended claims and their equivalents.

DETAILED DESCRIPTION

The following detailed description of the present subject matter refers to the accompanying drawings which show, by way of illustration, specific aspects and embodiments in which the present subject matter may be practiced. These embodiments are described in sufficient detail to enable those skilled in the art to practice the present subject matter. Other embodiments may be utilized and structural, logical, and electrical changes may be made without departing from the scope of the present subject matter. References to "an", "one", or "various" embodiments in this disclosure are not necessarily to the same embodiment, and such references contemplate more than one embodiment. The following detailed description is, therefore, not to be taken in a limiting sense, and the scope is defined only by the appended claims, along with the full scope of legal equivalents to which such claims are entitled.

Thermal Management

The present subject matter provides LED systems with improved thermal management, optical design, and control systems. The properties of an LED, such as chromaticity and luminous efficiency, are significantly affected by the temperature of the device and range widely between devices because of manufacturing variability. The relatively narrow spectral distribution of an LED requires that many primaries be combined to provide a broad spectral illumination for high color rendering index and wide color gamut. The inherent disadvantages of LEDs are exaggerated for applications that require high luminous density and output, uniform chromaticity and beam profile, and consistency between sources over their lifetimes. The disadvantages of LEDs are interdependent upon the thermal, optical, and control system applied; therefore, a holistic approach is necessary to provide an acceptable product.

Figure 1:
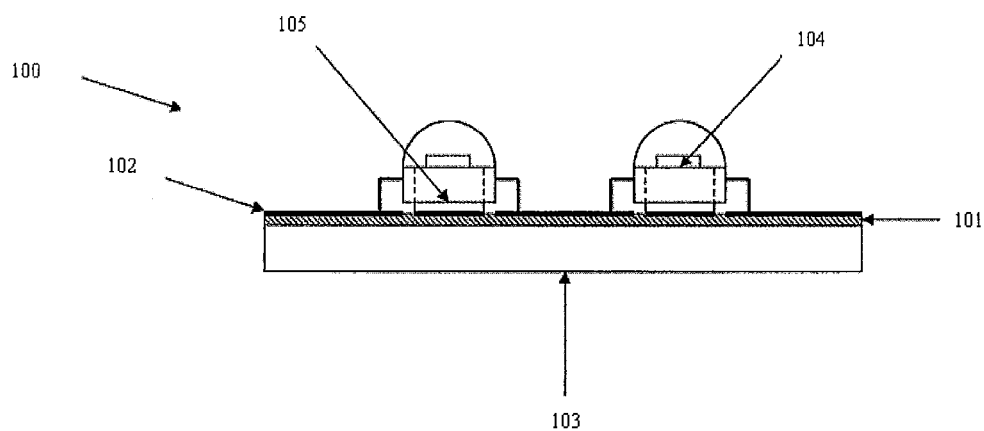
FIG. 1 illustrates a known metal core printed circuit board.

Similar to that of many semiconductor devices, the performance of an LED is tied to the junction temperature of the device. Typically, HB (high brightness) LEDs are reflow soldered to metal core printed circuit boards (MCPCB), which are well known in the art. FIG. 1 illustrates a known MCPCB. MCPCBs provide an advancement over typical resin based printed circuit boards in that they provide a substrate of high thermal conductivity in relatively close proximity to the heat generating component. In the illustrated MCPCB 100, a dielectric layer 101 is between the electrical circuit 102 and the electrically conductive metal substrate 103 to provide electrical isolation between the circuit 102 and substrate 103. Solid-state light emitting devices (LEDs) 104 are illustrated on the dielectric layer 101. However, the dielectric layer has poor thermal characteristics and has a thermally significant thickness, adversely affecting a thermal conduction path 105 from the LEDs to the substrate 103. Thus, significantly less heat is transferred from the electrical components than the substrate itself.

Because LED performance is tied to junction temperature it is advantageous to transfer heat from the LED package as quickly as possible. Eliminating the dielectric layer between the LED and the substrate allows for significant gains in thermal conduction from the LED die.

LED packages have mechanically and electrically isolated solder connection point(s), and various embodiments of the present subject matter use the connection point(s) to transfer heat from the LED package. The connection point(s) has a low thermal resistance to the LED die for effective heat transfer. Various embodiments of the present subject matter improve or maximize the heat transfer from the LED die by attaching this point to a thermally conductive substrate with no intervening dielectric layer. In order to accomplish this unique connection, an equally unique approach must be applied to the design and construction of the PCB (printed circuit board). In general, printed circuit boards do not provide variable thickness or interlocking layers, and tend to be purely planar constructions, as generally illustrated in FIG. 1.

Figure 2:
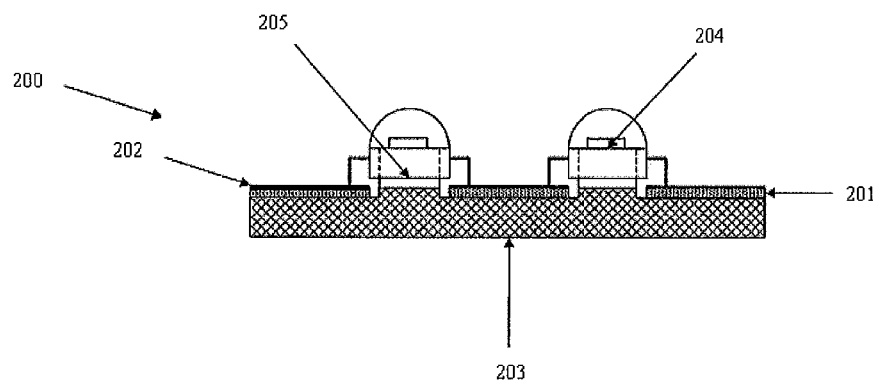
FIG. 2 illustrates an embodiment of an enhanced thermal attachment board.

FIG. 2 illustrates an embodiment of an enhanced thermal attachment board 200. Various embodiments, as generally shown in FIG. 2, position an LED component or package 204 such that a portion of the package is electrically connected to one body (an electrical circuit 202) for electrical power while another portion of the LED package 204 is directly connected to a separate body or directly to a highly conductive substrate 203 within the first body to primarily enhance heat transfer. An electric circuit 202 and dielectric 201 are fabricated with a hole at the isolated attachment point(s) of the specific LEDs. Through the hole(s) in the electrical circuit the thermally conductive substrate extends to the LED isolation point(s) to provide a path 205 of optimal or improved thermal conduction. This unique connection significantly lowers the thermal resistance between the LED package 204 and the thermally conductive substrate 203. To confirm the effectiveness of the disclosed invention a Philips Lumileds Rebel LED is documented to exhibit a thermal resistance of ten degrees per watt (K/W) between the case and the metal substrate when a best-in-class MCPCB is used. The same LED, when implemented as disclosed, has a thermal resistance of half a degree (0.5) per watt (K/W) between the same two points.

Figure 3:
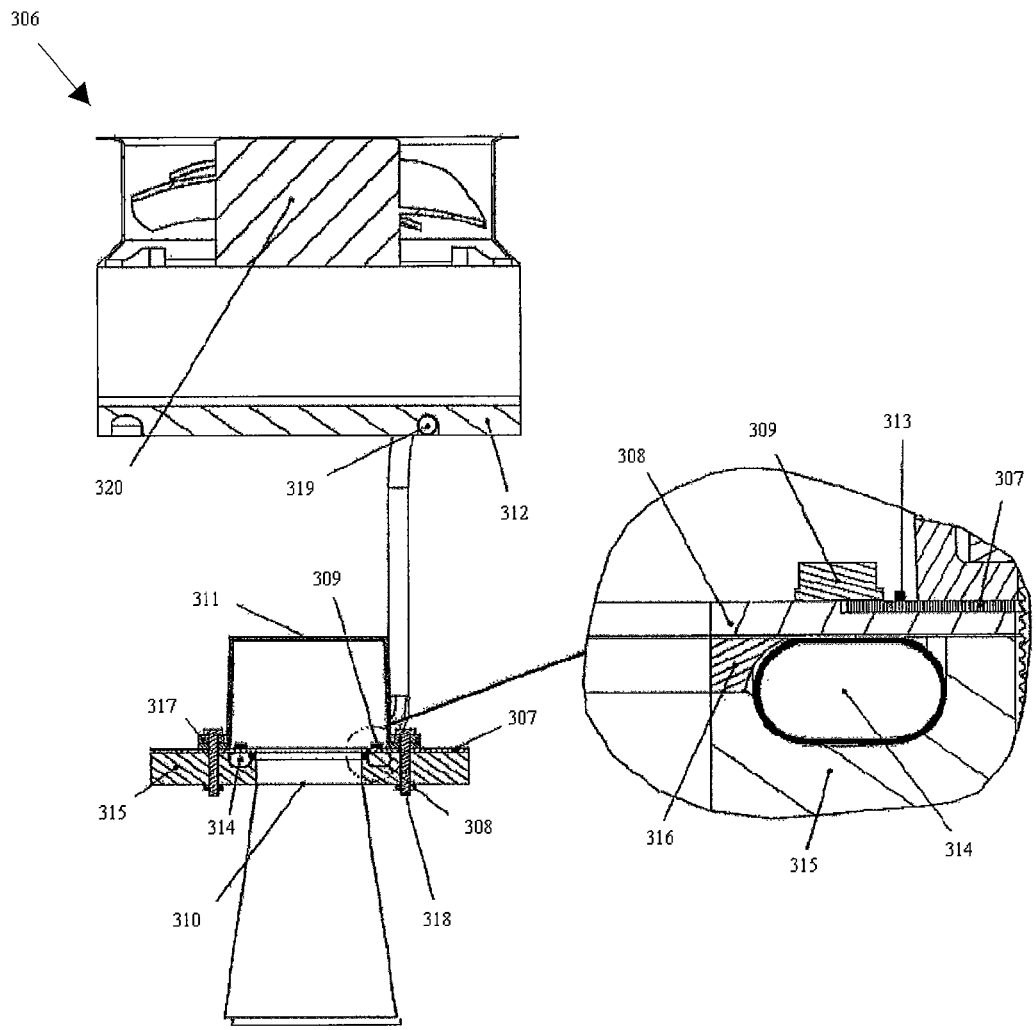
FIG. 3 illustrates an embodiment of a cooling system for an LED source lighting fixture.

FIG. 3 illustrates an embodiment of a cooling system for an LED source lighting fixture. The illustrated system 306 includes an electrical circuit and dielectric 307, a thermally conductive substrate 308, and an LED package 309. Once the heat is transferred from the LED to the thermally conductive substrate, the heat is efficiently dissipated to the surroundings. For LED lighting systems the optical system 310 is positioned as close as possible to the LED package 309 in order to reduce optical inefficiencies. While achieving the optical system's close proximity to the LED package, the distance between LED packages may be reduced in order to reduce the overall size of the optical system. When using multi-colored LEDs, which are disclosed herein, it is highly desirable to achieve thorough color mixing before the light beam exits the fixture.

Figure 5:
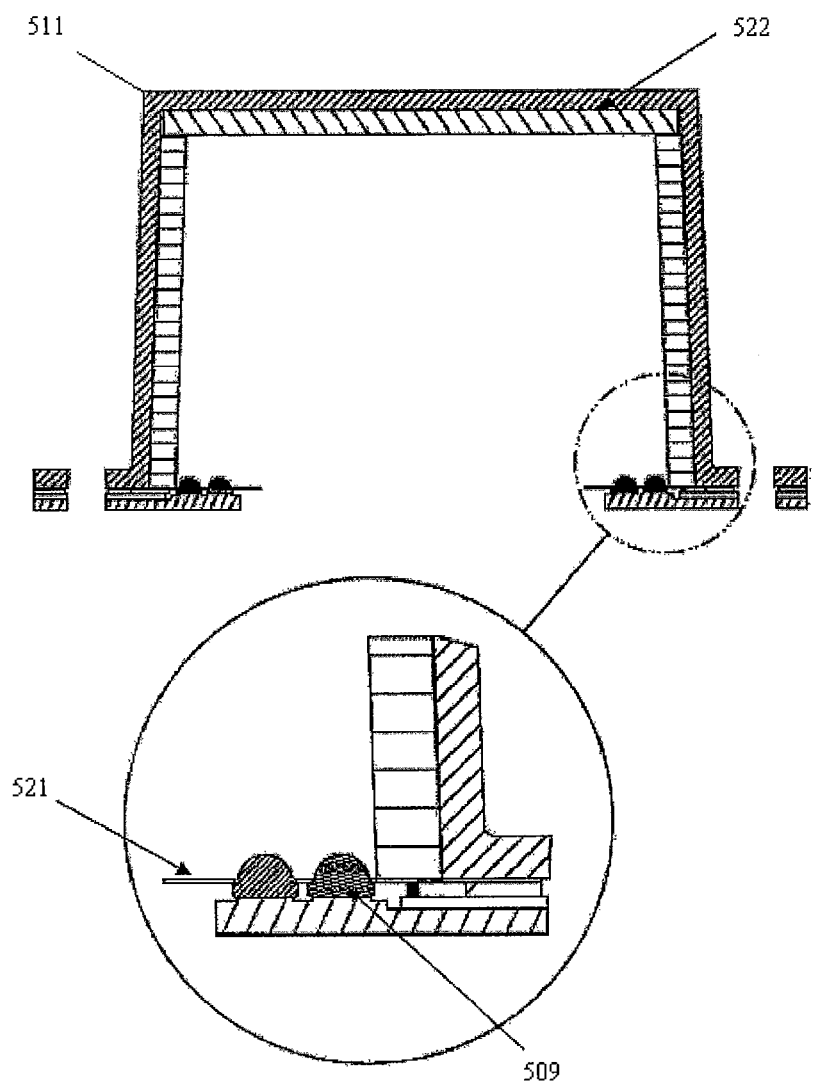
FIG. 5 illustrates an embodiment of a mixing chamber.

FIGS. 3 and 5 shows an embodiment that uses a mixing chamber 311, 511 to combine the colored light. The combined colored light exits through an exit aperture of the mixing chamber, where it is received by an optical system 310. The illustrated embodiment combines colored light, having at least two separate wavelengths, in a solid-state light source fixture by positioning the source(s) in a volume composed of reflective surfaces with region(s) of substantially diffuse characteristics and separate region(s) with substantially specular characteristics such that the light becomes appropriately mixed prior to exiting the volume. The multi-colored light emitted by LED(s) substantially overlaps within the cavity because of the significant number of reflections, which results in homogenous chromaticity and intensity. The combination of light in a cavity as described has potential of occurring in a compact volume with low optical losses. The efficiency of the aforementioned system depends on the magnitude of reflectivity (WL Gore manufactures a 3 mm thick PTFE material called DRP that has diffuse lambertian reflection characteristics of 99.2% reflection 400-700 nm; 3M manufactures a 65 micron thick coated material called Vikuiti ESR that has specular reflection characteristics of >98% reflection 400-700 nm) and the ratio of surface area of the cavity to the area of the exit aperture. The light sources are arranged in close proximity both to each other and to the exit aperture to minimize this ratio and maximize the luminous output. The present subject matter provides an effective thermal system that does not interfere with the mixing chamber 311 and optical system 310.

FIG. 3 illustrates one embodiment of a cooling system to transfer heat from an LED substrate 308 for an LED source lighting fixture to a heat dissipation body 312 having closed-loop control with sensor 313. An embodiment uses latent heat pumps, commonly known to the industry as heat pipes 314 (Enertron, Inc. of Tempe, Ariz. manufactures heat pipes of varying characteristics that can be selected based on well known principles). The use of a heat pipe provides ultra-high thermal conductivity so that minimal cross-sectional areas can be used to transfer large quantities of thermal energy without large temperature gradients.

Figure 4:
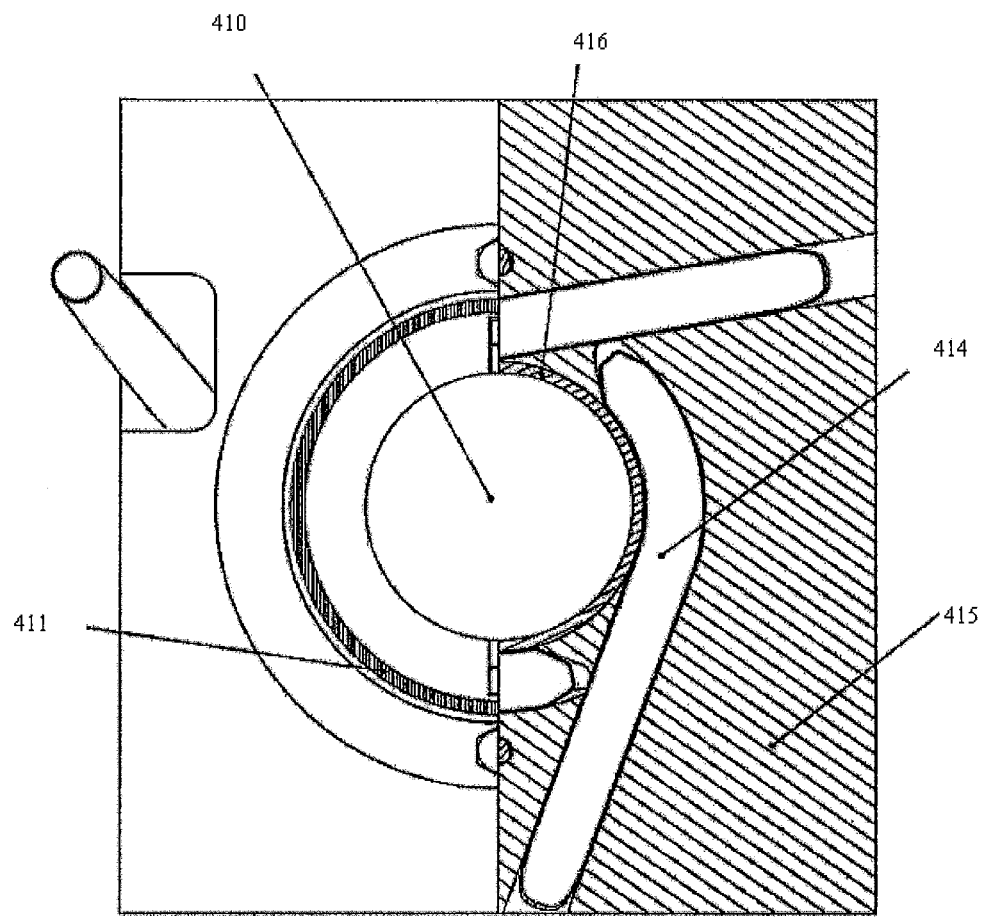
FIG. 4 illustrates an embodiment that uses latent heat pumps embedded in a cooling system.

FIG. 4 illustrates an embodiment that uses latent heat pumps embedded in a cooling system. A plurality of heat pipes 414, corresponding to 314 in FIG. 3, are arranged to form chords of a shape that approximates circle that circumscribes the exit aperture of the mixing chamber as a means to obtain minimal distance between the pipe wall and the LED package. FIG. 4 illustrates the optical system 410, which is positioned as illustrated at 310 in FIG. 3. The heat pipes run radially outward from the LED array so as to consume very little volume surrounding the LEDs. The heat pipe's cross-section, as shown in the detail of FIG. 3, is formed to provide a large surface contact area or maximize the surface contact area with the LED substrate 308 and the other conduction pathways 315, 415 and 316, 416 in the system. Depending on the LED arrangement, many cross-sections can be used (including but not limited to square, round, ellipse, rectangular, and triangular) so as to provide a large surface contact area or maximize the surface contact with that of an LED substrate or any other thermal pathway. A clamp assembly composed of a clamp ring 317, a bolt 318, a mixing cavity flange 411, and the conduction pathways 315, 415 and 316, 416 is used to minimize interstitial thermal resistance. Other embodiments such as spring loaded plates are disclosed as additional methods to provide clamp pressure to reduce interstitial thermal resistances. The heat dissipation body 312 of the disclosed cooling system can be any body, thermally connected to a heat pipe, with the purpose of dissipating thermal energy to the surroundings. For the heat dissipation embodiment shown in FIG. 3 a multi-finned aluminum extrusion is used with embedded heat pipe 319 and the heat exchange to the surroundings may use natural convection or forced air convection through the use of a fan 320.

Some cooling system embodiments include one or more thermally conductive substrate(s) concurrently interfacing a plurality of LED isolation points as well as a moving liquid. The LED package interfaces the thermally conductive substrate on one side, as previously disclosed, while the moving liquid interfaces the substrate, directly or indirectly, through the use of a chamber or tube on the opposite side of the substrate, as previously disclosed for the case of the heat pipe. This chamber or tube transfers the heat through conduction to the moving fluid. The fluid carries the heat to the heat dissipation body of the cooling system. The prime mover for the liquid is a pump with either integrated or external liquid storage. The heat dissipation body is a liquid-to-air heat exchanger using a common axial or centrifugal fan for air motion.

FIG. 5 illustrates an embodiment of a mixing chamber 511. The figure illustrates LEDs 509 positioned around an opening corresponding to the optical system, and further illustrates a specular reflective surface 521 and a diffuse reflective surface 522.

Color Mixing

The most common illumination and display devices use three source colors—red, green, and blue. The intensities of these source colors can be varied to produce different target colors. With three source colors there are well known methods for calculating the ratio of intensities that will produce a target color.

Since each source color can be expressed with three coordinates using the CIE XYZ color space and since CIE XYZ coordinates are additive, the color created by the combination of three sources can be represented as a linear combination as follows:

$$[X_{target}\ Y_{target}\ Z_{target}] = [R_{intensity}\ G_{intensity}\ B_{intensity}] \begin{bmatrix} X_{red} & Y_{red} & Z_{red} \\ X_{green} & Y_{green} & Z_{green} \\ X_{blue} & Y_{blue} & Z_{blue} \end{bmatrix}$$

The rows in the last matrix are the CIE XYZ coordinates of the source colors. The Y value of CIE XYZ coordinates represents the luminance of the source color, so when expressing chromaticity CIE XYZ coordinates are sometimes normalized to have Y=1 or Y=100. However the $Y_{red}$, $Y_{green}$, and $Y_{blue}$ values need to represent the relative luminance of the source colors.

To determine the ratio of intensities that will produce a target color the above equation would be rearranged as follows:

$$[R_{intensity}\ G_{intensity}\ B_{intensity}] = [X_{target}\ Y_{target}\ Z_{target}] \begin{bmatrix} X_{red} & Y_{red} & Z_{red} \\ X_{green} & Y_{green} & Z_{green} \\ X_{blue} & Y_{blue} & Z_{blue} \end{bmatrix}^{-1}$$

Multiplying the target color by the inverse of the source color coordinates yields $R_{intensity}$, $G_{intensity}$, and $B_{intensity}$ values that represent the ratio of intensities of the source colors.

The intensity values can then be normalized to have a maximum of 100% to produce the target color in the brightest possible way. As long as the ratio of intensities is maintained the target color can be dimmed. Because the solution is uniquely constrained, however, the calculated ratio is the only ratio that will produce the target chromaticity. Both of the equations above can be used for any three source colors, not just red, green, and blue.

Any set of three source colors can only produce a subset of the colors that the human eye can see. This subset of colors is referred to as the gamut of the source colors. By converting the source color CIE XYZ coordinates to CIE xyY' and plotting the points on the CIE xy chromaticity diagram, the gamut can be described graphically as all of the points inside of the triangle formed by the three source colors.

If the target color is not within the gamut of the source colors than one or more of the intensity values in the solution will be negative.

Systems with More than Three Source Colors

Some manufacturers have started using more source colors. Adding amber or white has been done by a number of entertainment lightning manufacturers. One entertainment lighting manufacturer, ETC, uses seven different colors of LEDs in its Selador series. LED manufacturers: Cree, Enfis, and Luminus Devices, have all started offering products with red, green, blue, and either amber or white all in one package, which are intended to make designing optical systems with four source colors easier.

There are several advantages of using more source colors than just red, green, and blue, including better color rendering, increased color gamut, and potentially higher luminance or luminous efficacy. However, the addition of another color changes the equation used to calculate the ratio of source color intensities.

$$[R_{intensity}\ G_{intensity}\ B_{intensity}\ A_{intensity}] = [X_{target}\ Y_{target}\ Z_{target}] \begin{bmatrix} X_{red} & Y_{red} & Z_{red} \\ X_{green} & Y_{green} & Z_{green} \\ X_{blue} & Y_{blue} & Z_{blue} \\ X_{amber} & Y_{amber} & Z_{amber} \end{bmatrix}^{-1}$$

Because the 4×3 matrix is not square it is non-invertible. The solution is underdetermined, which means that there are an infinite number of solutions. This presents the problem of what solution to use, and how to find that solution.

Solving for Systems with More than Three Source Colors

One method for finding the solution is to find solutions for sets of three color sources at a time and combine these solutions into a final solution. As an example, we'll use a device with five color sources: red, amber, green, cyan, and blue. These five colors are then grouped into sets three source colors. There are ten combinations: RAG, RAC, RAB, RGC, RGB, RCB, AGC, AGB, ACB, and GCB. Each of these combinations can then be solved in the regular way using equation 2 from above. Those that have negative values in their solutions are discarded. Then the intensities for each source color from each of the remaining combinations are summed together.

This method has several desirable qualities. The final solution tends to be fairly bright, usually brighter than any single combination. Since it uses every combination that it can, it provides some contribution from all of the color sources, which means that the target color will be produced with a fuller spectrum than if only three source colors were used.

Also if the source colors are not accurately measured or if the source colors change intensity or chromaticity with time then there will be some error in the calculated target value. However, by using all of the combinations the error in any one calculation will tend to be reduced by the other combinations.

This method does not produce the brightest possible solution, or the solution with the highest luminous efficacy. Also the brightness may not change smoothly over the gamut. In our testing, using this method with at least one set of color sources the brightness was found to dip lower in the center of the gamut, instead of being the dimmest at the edges and continually increasing as it approached the center, as was expected.

Several innovative advancements have been found for color mixing in systems using four or more source colors. The source colors are broken into groups of three light sources, as described above and in US Publication 20070103646 (application Ser. No. 11/557,861) entitled APPARATUS, METHODS, AND SYSTEMS FOR MULTI-PRIMARY DISPLAY OR PROJECTION, which is incorporated herein by reference in its entirety. An optimization technique is then described for determining if a target color is within the gamut of the source colors before trying to find a solution for the group of three. A method is introduced for finding an equivalent target color with reduced saturation, when the original target color is completely out of the gamut of the source colors. An optimized method for finding the solution ratios of each group of three is presented. Once the groups of three have been solved, there is the problem of how to combine the ratios into one final ratio that uses all five colors. Two different methods of solving this problem are described. One method is capable of finding the brightest possible final solution. It can also be used to limit the power consumption of the source colors, which effectively maximizes luminous efficacy. The second method produces colors whose brightness and spectral power dissipation change smoothly and uniformly across the gamut.

Gamut Detection

If solving for a group of three source colors involves multiplying a 1×3 matrix by a 3×3 inverse matrix, the total number of operations can become processing intensive. For example, in a system that uses seven source colors, it is necessary to solve thirty-five groups of three. Many of those thirty-five will produce negative numbers and have to be discarded. This number of groups of three that have to be solved for a given number of source colors is calculated as:

<number of source colors> choose 3

By calculating the cross product of the vectors formed between pairs of source colors and the target color using CIE xy coordinates, it is possible to determine if a group of three is going to be discarded, using a less processing intensive calculation than multiplying the matrices. For seven source colors twenty-one cross products would need to be calculated. In general the number of cross products is given by:

<number of source colors>choose 2

This method requires CIE xy coordinates, while solving using the matrix multiplication requires CIE XYZ coordinates. Coordinates can be transformed between the two color systems using the following equations:

$$x = \frac{X}{X+Y+Z} \quad y = \frac{Y}{X+Y+Z}$$

$$X = \frac{Y}{y}x \quad Z = \frac{Y}{y}(1-x-y)$$

A discussion of the CIE xy and CIE XYZ color spaces is found in Appendix A of U.S. Provisional Application 61/226,205.

In order to determine if the group of three is going to be discarded, it is necessary to determine if the target color is inside or outside of the triangle formed by the three source colors. For a triangle, ABC and a target color P, the cross products are AB×AP, BC×BP, and CA×CP. If the triangle calls for a specific cross product and like AB×AP, and the reverse was calculated (BA×BP), then use the negative of the cross product that has already been calculated. So in the case of AB×AP, one could use −(BA×BP) instead.

If all three cross products have the same sign, then the target color is inside of the triangle. Otherwise they are outside of the triangle, and this group of three should be discarded.

A discussion of the equations of the point in triangle test is found in Appendix B of U.S. Provisional Application 61/226,205.

A further optimization of this same technique is to determine if the target color can even be produced at all, or if it is out of the gamut formed by all of the source colors. Normally it is not until every group of three has been discarded that it becomes clear that the source color cannot be produced. However, if we have a list of the source colors on the edge of the gamut, and the list is in either clockwise or counter-clockwise order around the gamut, we just need to look at the cross products of each edge of the gamut in order. If they are all the same sign, then the target is within the gamut of the color sources. If some are positive while others are negative then there is no way to produce the target color with the source colors.

Gamut Compression

If the cross products indicate that a target color is out of the gamut of the source colors or the all of the groups of three are discarded, it is clear that the target color cannot be produced. When this happens, it is generally desirable to produce the closest approximation that can be produced.

The closest approximation could have multiple meanings. One could find shortest distance from the target color to the edge of the gamut in a perceptually uniform color space like CIELUV. The CIE xy coordinates used for the cross products can be transformed to and from CIELUV u'v' chromaticity coordinates using the following transformations:

$$u'=4x/(-2x+12y+3) \quad v'=9y/(-2x+12y+3)$$

$$x=9u'/(6u'-16v'+12) \quad y=4v'/(6u'-16v'+12)$$

A discussion of these transformations and the CIELUV color space is found in Appendix C of U.S. Provisional Application 61/226,205.

Figure 7:
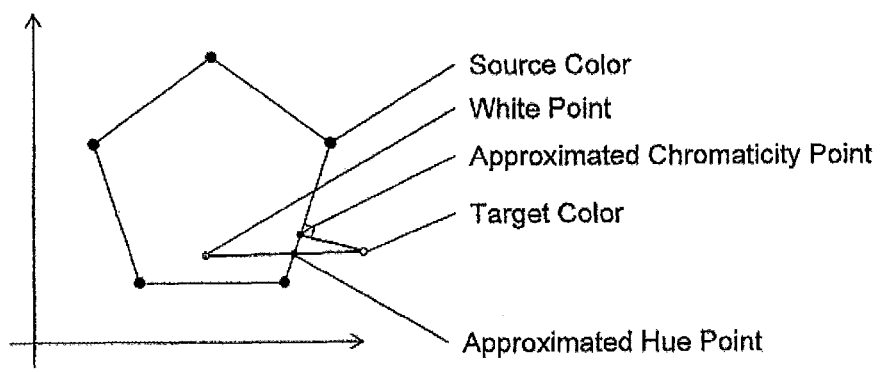
FIG. 7 illustrates an approximated chromaticity point and an approximated hue point for a target color outside of the gamut formed by all of the source colors.

Since each edge of the gamut is still a straight line in the CIELUV chromaticity diagram, the distance from a point to a line can be calculated for each edge of the gamut and using the point at the shortest distance, illustrated generally in FIG. 7. For a target color P at CIELUV chromaticity coordinates (u'$_P$, v'$_P$), the distance from a point to the edge formed by source colors A and B at (u'$_A$, v'$_A$) and (u'B, v'B) can be found as follows:

$$q = \frac{(u'_P - u'_A)(u'_B - u'_A) + (v'_P - v'_A)(v'_B - v'_A)}{(u'_A - u'_B)^2 + (v'_A - v'_B)^2}$$

if $0 \leq q \leq 1$ then $$u' = u'_A + q(u'_B - u'_A)$$

-continued $$v' = v'_A + q(v'_B - v'_A)$$

$$d = \sqrt{(u'_A - u'_B)^2 + (v'_A - v'_B)^2}$$

else determine which vertex the point is closer to $$d = \min(\sqrt{(u_A'-u_P')^2 + (v_A'-v_P')^2}, \sqrt{(u_B'-u_P')^2 + (v_B'-v_P')^2})$$

use the closest vertex as the values for (u', v')

The (u', v') coordinates with the smallest value for d have the closest chromaticity values. A discussion of the equations for calculating minimum distance between a point and a line or line segment is found in Appendix D of U.S. Provisional Application 61/226,205.

It may look more natural to instead keep the same hue and just reduce the saturation, especially if the color target is being specified using hue and saturation values. In order to calculate a point with the same saturation it is necessary to draw a line from the white point to the target color, and determine where this line intersects the edge of the gamut (see FIG. 7). Some systems use the color made when all color sources are full on, as the white point. This is sometimes correct, but the white point should either be specified by the media (often D65), or the chromaticity used for white lighting (often around 3000K). If the white point is not known, the equal energy point E can be used. E is the white point in systems where the observer is not chromatically adapting.

Once a white point is selected as $(x_W, y_W)$, the following equations can be used to determine if the line through the target color, $(x_P, y_P)$, intersects the edge of the gamut between source colors A and B at $(x_A, y_A)$ and $(x_B, x_B)$.

$$q_1 = \frac{(x_W - x_P)(y_A - y_P) - (y_W - y_P)(x_A - x_P)}{(y_W - y_P)(x_B - x_A) - (x_W - x_P)(y_B - y_A)}$$

$$q_2 = \frac{(x_B - x_A)(y_A - y_P) - (y_B - y_A)(x_A - x_P)}{(y_W - y_P)(x_B - x_A) - (x_W - x_P)(y_B - y_A)}$$

if $0 \le q_1 \le 1$ and $0 \le q_2 \le 1$ then this is the edge of the gamut that intersects $$x = x_A + q_1(x_B - x_A)$$

$$y = y_A + q_1(y_B - y_A)$$

A discussion of the equations for calculating the intersection point of two lines or line segments is found in Appendix E of U.S. Provisional Application 61/226,205.

Solving Groups of Three Source Colors

It has already been described how the groups of three source colors can be solved using an inverse matrix. However since the cross products of each pair of source colors have already been found, there is a more efficient method of finding the ratio of source colors that will produce the target color.

If all three source colors in a group had the same weighting, the ratio of source color intensities would simply be the ratio of cross products as shown below for source colors ABC and target color P:

$$I_A = |BC \times BP| \quad I_B = |CA \times CP| \quad I_C = |AB \times AP|$$

Note that each source color intensity matches with the cross product for the line segment across from itself. However, the source colors do not have the same weighting. Not only do they each have a different luminous output, Y', for the same intensity, but the source colors with small y-values have additional weighting. Essentially, each source color has a weighting of Y'/y, so dividing each cross product by the appropriate weighting will give the actual ratio of intensities.

$$I_A = \frac{y_A}{Y'_A} |BC \times BP|$$

$$I_B = \frac{y_B}{Y'_B} |CA \times CP|$$

$$I_C = \frac{y_C}{Y'_C} |AB \times AP|$$

These chromatic weightings can be computed and cached so that these calculations simply consist of multiplying a cached value by the cross product that was already being computed, making them extremely fast. This system also eliminates the only part of the system that uses CIE XYZ color coordinates, so that color points do not need to be converted back and forth between the two color spaces.

Computing the Brightest Combination

After the ratios of each group of three source colors are computed, we are left with the problem of how to combine these ratios into a final, optimum solution that takes advantage of all the sources. The optimum solution can be different for different applications, but one common definition of optimum would be the brightest possible combination of colors. The following method finds the maximum brightness possible, by using linear programming techniques and the solutions to the groups of three source colors.

Essentially, there are a number of ratios that can be mixed in any amount, so long as the total contribution of any one source color is always less than or equal to 100%. This can be seen as a linear combination, with inequality constraints. If we want to optimize for some parameter, then it would be a linear optimization problem with constraints. The mathematical field of linear programming offers a number of algorithms that can be used. The simplex method is used for maximizing or minimizing a parameter of a linear combination with equality or inequality constraints, which is ideal for this application.

In order to use the simplex method to maximize the brightness we have to have a number of linear equations that form the constraints, plus one linear equation whose solution we want to optimize. In this case, we will have the same number of constraint equations as we have source colors. Each term in the constraint equations represents a solution for one of the groups of three. The following example shows how the constraint equations would be formed from a set of solutions.

| | |
|---|---|
| RAG = (0.70, −0.45, 1.0) | RCB = (0.85, 1.0, −0.95) |
| RAC = (0.10, 0.65, 1.0) | AGB = (0.25, 1.0, 0.60) |
| RAB = (0.90, 1.0, −1.3) | AGC = (1.0, −0.15, 0.95) |
| RGC = (1.0, 0.80, 0.75) | ACB = (1.0, 0.55, 0.20) |
| RGB = (0.05, 1.0, 0.40) | GCB = (1.0, −0.30 0.50) |

$0.10a + 1.0b + 0.05c + 0d + 0e \le 1$, red constraint $0.65a + 0b + 0c + 0.25d + 1.0e \le 1$, amber constraint $0a + 0.80b + 1.0c + 1.0d + 0e \le 1$, green constraint $1.0a + 0.75b + 0c + 0d + 0.55e \le 1$, cyan constraint $0a + 0b + 0.40c + 0.60d + 0.20e \le 1$, blue constraint Note that the solutions for RAG, RAB, RCB, AGC, and GCB were not used because they contained negative numbers, indicating that the target color was outside of the gamut of these particular groups. So the variables a, b, c, d, and e represent the ratios RAC, RGC, RGB, AGB, and ACB respectively. Also note that the solution ratios have all been normalized to have a maximum of 1.0. The simplex method will find the same solution even if the ratios are not normalized, but it is shown here for clarity. These constraint inequalities will form the rows of a matrix used by the simplex method, called the initial tableau. Each variable will become a column of the matrix. Each column represents the solution to one of the groups of three, which is why there will never be more than three non-zero values in these constraint columns.

The last row of the initial tableau is the function that we want to maximize, called the objective function. We need a function that calculates brightness, so that brightness can be maximized. Since we are combining the solutions of the groups of three, we need to calculate how bright each group of three is on its own. This can be done by multiplying each coefficient from the column by the brightness of that light source. For example, assume that the colors red, amber, green, cyan, and blue have the output of 400, 600, 1000, 800, and 200 lumens respectively. Then for the first column (RAC), represented by the variable a, above:

$$400(0.10)+600(0.65)+1000(0)+800(1.0)+200(0)=1230 \text{ lumens}$$

When calculated for the remaining four columns the following equation results:

$$1230a+1800b+1100c+1270d+1080e=p$$

With the constraint inequalities and objective function we can set up the initial tableau. The coefficients from the left side of our constraint inequalities and the negated objective function will form the first five columns. Then we add in "slack" variables to each inequality, and one to the objective function. Since every constraint is an inequality, every row will need a "slack" variable. These "slack" variables take the form of a square identity matrix. Then the last column contains just the values from the right side of each constraint inequality and a zero for the objective equation. The following shows the initial tableau for the example system:

The pivot row is then selected finding the row with the smallest a "test ratio". Only positive numbers can be pivots, so negative and zero values in the pivot column are ignored. For the remaining values a "test ratio" is computed by dividing the value in the same row of the last column by the value in the pivot column. The smallest "test ratio" is the pivot.

Use row-subtraction and row-multiplication to clear the pivot column using the pivot row. This is the normal pivoting process used with matrices in linear algebra. Each row besides the pivot row has some multiple of the pivot row subtracted from it so that the value in the pivot column becomes zero.

A discussion about pivoting matrices is found in Appendix F of U.S. Provisional Application 61/226,205.

Once all of the numbers in the last row are non-negative, with the possible exception of the last column the solution can be computed. For each column with more than one non-zero value the solution is zero. For example, after pivoting the first and third columns have more than one non-zero value, so the solution for both variable a and variable c is zero. For the other columns, the same "test ratio" that was using in pivoting is calculated for the value in each column. These "test ratios" are the solutions for those variables.

In the above example the optimal solution turns out to be:
p=2763, a=0, b=0.683, c=0, d=0.453, e=0.887

The p variable indicates the total lumen output. The other values indicate how much of each group of three to use. Since values a and c are zero we will not use the RAC and RGB at all. For the other three columns (RGC, AGB, ACB) we use the following amounts of each group of three: 0.683, 0.453, and 0.887.

$$1.0(0.683)+0(0.453)+0(0.887)=0.683, \text{ red}$$

$$0(0.683)+0.25(0.453)+1.0(0.887)=1.00, \text{ amber}$$

$$0.80(0.683)+1.0(0.453)+0(0.887)=0.999, \text{ green}$$

$$0.75(0.683)+0(0.453)+0.55(0.887)=1.00, \text{ cyan}$$

$$0(0.683)+0.60(0.453)+0.20(0.887)=0.449, \text{ blue}$$

| | Left-hand side of equations | | | | | Slack variables | | | | | | Right-hand side of equations |
|---|---|---|---|---|---|---|---|---|---|---|---|---|
| Constraint inequalities | 0.10 | 1.0 | 0.05 | 0 | 0 | 1 | 0 | 0 | 0 | 0 | 0 | 1 |
| | 0.65 | 0 | 0 | 0.25 | 1.0 | 0 | 1 | 0 | 0 | 0 | 0 | 1 |
| | 0 | 0.80 | 1.0 | 1.0 | 0 | 0 | 0 | 1 | 0 | 0 | 0 | 1 |
| | 1.0 | 0.75 | 0 | 0 | 0.55 | 0 | 0 | 0 | 1 | 0 | 0 | 1 |
| | 0 | 0 | 0.40 | 0.60 | 0.20 | 0 | 0 | 0 | 0 | 1 | 0 | 1 |
| Objective function | -1230 | -1800 | -1100 | -1270 | -1080 | 0 | 0 | 0 | 0 | 0 | 1 | 0 |

Once the initial tableau is put together a maximum value can be found by repeatedly pivoting the tableau. The pivoting process requires for selecting a pivot column, then finding the pivot from the pivot column, and finally actually pivoting the tableau.

The pivot column is selected by looking at the value that each column has in the last row of the tableau, excluding the last column. The column with the negative number of the largest magnitude is the pivot column. If all the columns are non-negative then the pivoting process is complete.

By setting the source colors in these ratios, the example target color can be created in the brightest possible way. In this particular case, this solution is 54% brighter than any combination of just three colors. It is also 19% brighter than trying to use equal amounts of all five combinations.

A discussion about the simplex method is found in Appendix G of U.S. Provisional Application 61/226,205.

Besides producing the brightest possible color, this method produces the brightest combinations in the center that smoothly reduce in brightness towards the edge of the gamut. However, while the brightness changes smoothly, the spectrum of the output can change very abruptly. Even for two target colors that are very close together it is not uncommon for this method to result in two very different spectrums. Because of differences in color vision between observers the two different spectrums may make the colors seem to not transition smoothly, or not match in the intended way.

Controlling Power Consumption

In systems where the power to the individual source colors is turned up or down to change the target color, the simplex method can also be used to control the overall power consumption of the source colors. By limiting the sources to a maximum, overall power consumption, and optimizing for brightness, the simplex method maximizes luminous efficiency. All that has to be done is to add a row to the initial tableau that represents the power consumption, and set it to be less than or equal to some value.

For an example, assume the source colors red, amber, green, cyan, and blue used 10 W, 15 W, 30 W, 25 W, and 20 W respectively. For each group of three source colors, the wattage of each source color is multiplied by the intensity of the source color to find the total power consumption of the group. In the above example, the group RAC, used 10% red, 65% amber, and 100% cyan. So the total power consumption of the group is given by:

$$0.10(10)+0.65(15)+1.0(25)=35.75 \text{ watts}$$

The power consumption for the other four groups of source colors can be calculated in the same way. This gives the following function for power equation:

$$35.75a+52.75b+36.5c+42.75d+31.75e \leq \text{maximum power consumption}$$

The initial tableau is already set up to not use more than 100% of any single source color, so the power consumption will never be greater than the 100 W used when all five sources are full on. So setting the maximum power consumption to 100 or higher will never affect the solution. Lower settings still may not affect the solution depending on the target color. For example if the target color is set right at the red source color, all the other source colors will have to be turned off. So as long as the maximum power consumption is set above the 10 W that red uses, the power consumption limit will not affect the solution.

But the power consumption could be set to a number like 75 W which would allow a lower wattage, power supply to be used and a lower performance thermal system while still maximizing brightness for the given wattage. The system will be dimmer for target colors close to the color made by the color sources being full on. However the described method guarantees that it will sacrifice the minimum number of lumens to keep the system below the 75 W threshold.

The table below shows how the power consumption constraint would be added (shown in first row) to the example from above.

Smooth Source Color Transitions

As mentioned above, optimizing for brightness produces the brightest possible color at the color where the source colors are all fully on, and it reduces in brightness smoothly toward the outside of the gamut. This smooth, uniform transition in brightness is desirable. However, the individual source colors do not transition smoothly. As mentioned, it is not uncommon for two nearby target colors to end up with very different spectral power distributions. While these nearby target colors should appear to transition smoothly in theory, they may not due to variation from observer to observer. This effect is called observer metamerism, or observer metameric failure.

Figure 6:
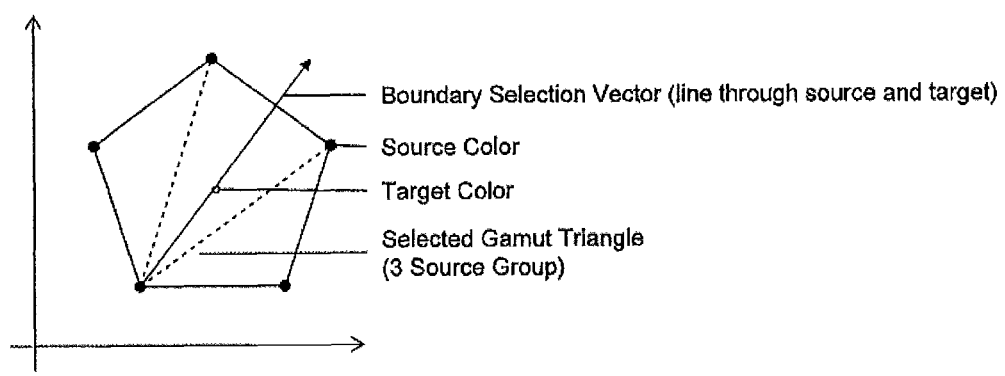
FIG. 6 illustrates a geometrical representation of a method for selecting a solution ratio to reduce or minimize metameric effects where source colors do not transition smoothly.

Another innovative method takes a geometric approach to the problem of minimizing these metameric effects. This method selects only one solution ratio for each source color, instead of using all of the solution ratios. For each source color a line is drawn on the CIE xy chromaticity diagram from the source color, through the target color, to the opposite side of the gamut (see FIG. 6). The two source colors on either side of the gamut edge that the line intersects, plus the original source color form a group of three that is selected as one of the solution ratios to use. The idea is that as the target color moves further away or closer to a single source color, that source color will dim or brighten uniformly as desired while the opposite side of the gamut will brighten or dim correspondingly.

While the idea is based in geometry, when applying the method it is not necessary to calculate any of the geometry. The color sources can be split up into groups of three and solved as normal. Then it is just necessary to select the correct group for each source color. The correct group will always be the only group that contains both the source color and two other source colors that are adjacent to each other. Ordering the source colors by wavelength makes it easy to search for an adjacent pair of source colors.

Using the example from above, the group for each source color is shown below:

Red intersects the Green-Cyan edge: RGC=(1.0, 0.80, 0.75)

Amber intersects the Cyan-Blue edge: ACB=(1.0, 0.55, 0.20)

Green intersects the Blue-Red edge: RGB=(0.05, 1.0, 0.40)

Cyan intersects the Red-Amber edge: RAC=(0.10, 0.65, 1.0)

Blue intersects the Amber-Green edge: AGB=(0.25 1.0, 0.60)

In this particular case all the groups are used, and no groups are used twice. However such situations do occur. If a group is used twice there will just be twice as much of that ratio used. It is treated just like any other group that is selected.

In order to calculate the final solution ratio, occurrences of each source color are a summed. For example, red occurs in the first, third, and fourth ratios. So the value for red in the final solution is calculated as follows:

$$1.0+0.05+0.10=1.15$$

| | | | | | | | | | | | | |
|---|---|---|---|---|---|---|---|---|---|---|---|---|
| 35.75 | 52.75 | 36.5 | 42.75 | 31.75 | 1 | 0 | 0 | 0 | 0 | 0 | 0 | 75 |
| 0.10 | 1.0 | 0.05 | 0 | 0 | 0 | 1 | 0 | 0 | 0 | 0 | 0 | 1 |
| 0.65 | 0 | 0 | 0.25 | 1.0 | 0 | 0 | 1 | 0 | 0 | 0 | 0 | 1 |
| 0 | 0.80 | 1.0 | 1.0 | 0 | 0 | 0 | 0 | 1 | 0 | 0 | 0 | 1 |
| 1.0 | 0.75 | 0 | 0 | 0.55 | 0 | 0 | 0 | 0 | 1 | 0 | 0 | 1 |
| 0 | 0 | 0.40 | 0.60 | 0.20 | 0 | 0 | 0 | 0 | 0 | 1 | 0 | 1 |
| −1230 | −1800 | −1100 | −1270 | −1080 | 0 | 0 | 0 | 0 | 0 | 0 | 1 | 0 |

When the other source colors are calculated in the same way we get the following:

R: 1.15 A: 1.90 G: 2.8 C: 1.95 B: 1.2

Because there are no constrains in this method, the source colors will not be limited to 100%. However it is the ratio that matters. The above solution can be divided by the maximum value (2.8) to obtain a solution normalized to 1.

R: 0.41 A: 0.68 G: 1.0 C: 0.70 B: 0.43

Optically Monitoring LED Light Sources

When combining multiple source colors of light to create a target color, it is necessary to be able to accurately to determine the chromaticity of each source color and the intensity of the source colors relative to each other. The less accurate the chromaticity and intensity measurements of the source colors, the less accurately the target color will be produced. This can result in two LED light sources that are both set to the same target color, but do not appear to match exactly.

This is a byproduct of the variability that is inherent in the manufacture of LEDs. The variability is such that two LEDs with the same part number from the same manufacturer may have significantly different chromaticity and intensity. Even when manufacturers bin the LEDs so that the wavelength and intensity are within some known range, the ranges are usually too large to provide enough accuracy.

In order to overcome this, the LEDs of each light source can be measured with a spectrometer to determine the exact chromaticity and intensity. Target colors will then be reproduced accurately at the temperature that the LEDs were measured at. As the temperature increases LED output intensity is reduced and the wavelength may shift. The same changes take place permanently over thousands of hours of usage. Since one of the selling features of many LED light sources is the long life, it would seem important to maintain accuracy in produce target colors over that lifetime.

Color sensors like the MAZeT MTCSiCS can be used to monitor the LED light sources over their lifetime. The response curves of the MAZeT MTCSiCS are intended to match the tristimulus response curves of the human eye.

The published material from MAZeT appears to indicate that, while the shapes of tristimulus curves are a close approximation, the areas under the curves are not normalized. According to the typical response curve information from MAZeT, the correction factors for X, Y, and Z are 0.445, 0.453, and 1.00 respectively.

The above correction factors attempt to correct for the response curves over the whole spectral range, from 400 nm to 1000 nm. LEDs typically produce relatively narrow spectral power distributions—around 40 nm to 60 nm. Because of this, the correction factors may be significantly inaccurate over the small spectral range of an individual LED color source. We have found that even if the response curves exactly match the MAZeT's typical response curves, the above correction factors cannot provide enough accuracy. Additionally, the response curves may vary from one color sensor to another providing further inaccuracy.

Various embodiments of the present subject matter provide a method of sampling and calibration that improves the accuracy of measurements. Each LED source color is sampled in turn with both a color sensor internal to the product, and an external color measurement device like a calibrated spectrometer. Optionally, the LED source colors may also be measured at different current levels, and different temperature levels to provide more data points. These pairs of measurements are then used in a number of different ways to create correction factors and correction matrices that are more accurate than the standard correction values. Since each LED light source is measured and calibrating using its own color sensor.

Each of the following correction methods requires a set of measurements. Because of the variation in the LED color sensors and the variation in color sensors, the maximum accuracy is obtained by measuring each LED light source. Each LED source color should be turned on individually and measured with both a calibrated spectrometer and the internal color sensor.

Custom Overall Correction Factors

By creating custom correction factors for specific LED color sources, the accuracy in measuring over the specific wavelengths of the LED color sources can be improved. The most accurate set of correction factors can be found by computing the least-squares fit of the internal color sensor measurements to the calibrated spectrometer measurements for all three tristimulus values: X, Y, and Z.

For each tristimulus value there are color sensor measurements (a1, a2, a3 . . . an) and spectrometer measurements (b1, b2, b3 . . . bn). To calculate the least-squares fit for this data the sum of the products is divided by the sum of the spectrometer measurements squares.

$$\frac{\sum_{i=1}^{n} a_i b_i}{\sum_{i=1}^{n} b_i^2} = \text{correction factor}$$

To use these correction factors any value measured with the color sensor is multiplied by its correction factor to obtain a close approximation of the actual value of any of the LED color sources. When the LEDs color sources shift with time, temperature, or current the correction factors may no longer be the best possible correction factors. However they will almost certainly still be more accurate than the generic correction.

Individual LED Source Color Correction Factors

The above method tries to find the best possible correction factors for all of the LED color sources at once. While the simplicity of a single set of correction factors is advantageous, additional accuracy can be obtained by calculating different correction factors for each LED color source. These correction factors can be obtained by dividing each measurement from the spectrometer by the corresponding measurement from the color sensor.

This will create a set of three correction factors (X, Y, and Z) for each color source. Generally when using these correction factors, only one source is turned on at a time, and the set of correction factors for that specific source is used to correct the measurement. Each color source measurement will then be perfectly corrected. As the LEDs color sources shift with time, temperature, or current the correction may no longer be perfect, but it should always be m more accurate than the generic, or using only single set of custom correction factors.

Correction Matrices Using Three Sources at a Time

In systems that use four or more LED color sources correction matrices can be used to provide an accurate correction. A correction matrix is calculated for every combination of three LED source colors at a time. For four source colors this is just four matrices and for five source colors it is ten matrices. The number of matrices needed for n source colors can be calculated using the combinatorial function C(n, 3).

Each correction matrix of three LED source colors is calculated by putting the X, Y, and Z values measured with the spectrometer from each LED color source as a column in one 3×3 matrix. And the X, Y, and Z values measured with the internal color sensor as the same column in a second 3×3 matrix. Then multiply the first matrix by the transpose of the inverse of the transpose second matrix. This will produce the correction matrix.

In order to use these correction matrices, the LED source colors are measured in groups of three instead of one at a time. Use the X, Y, and Z values as a 3×1 matrix. Multiply the correction matrix by the 3×1 matrix to get a corrected 3×1 matrix of X, Y, Z values for the combination. After repeating this process for every other combination of three source colors, create a matrix using the transpose of these corrected 3×1 matrices as rows.

Next create a matrix with the same number of columns as there are LED source colors. For each row added to the matrix with the corrected measured data, add one row to this new matrix that describes what color sources were on during the measurement by placing ones in the column representing the source color. All the other columns should be zero for the row to indicate sources that were turned off. Once complete, this matrix should be inverted using the Moore-Penrose pseudoinverse.

A matrix containing the source color X, Y, Z values can be obtained by taking the transpose of the result of multiplying the pseudoinverse by the matrix with the corrected measured data. The columns in this final matrix represent the source colors (in reverse order that they were used in the matrix that was inverted using the Moore-Penrose pseudoinverse). The rows represent X, Y, and Z values.

The previous method of correcting for each color source with its own set of three correction factors has tended to be more accurate especially when one or more of the source colors has a broad spectrum. However the method of using combinations of three with this pseudoinverse has shown to be more accurate in some simulations. All the methods provide substantial improvement over using three generic correction values.

Color Sensor Sampling Procedure

Figure 8A:
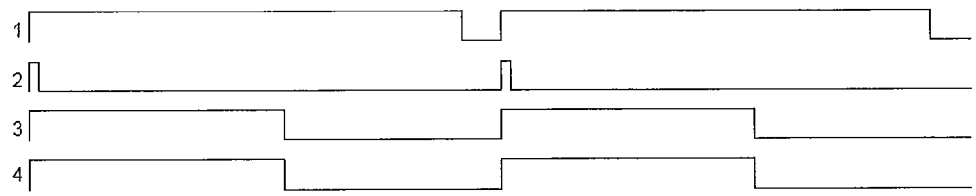
FIGS. 8A-8B illustrate pulse width modulation signals for color sources and the manipulation of these signals to enable color sensor sampling, according to various embodiments.

In order to use the above techniques it is necessary to measure each color source individually. When using pulse width modulation to control the intensity of each color source, it is likely that there is more than one color on at any given time. FIG. 8A is an example of four color sources being mixed in different amounts to produce some complex color. The four signals—1, 2, 3, and 4—show the relative on and off times for two cycles of each color source. In FIG. 1, there is plenty of time to take a sample of color source 1 after all the other color sources have turned off. But there is never a time when any of the other color sources can be sampled since color source 1 is turned on the entire time.

In order to be able to sample each color, it is necessary have a separate sampling procedure. All the color sources are turned off, and a dark sample is taken. Then each of the color sources is turned on and sampled, one after another. This method allows all of the color sources to be measured independently.

This procedure might be used as user-triggered calibration function or part up the system startup, to maintain an accurate calibration with aging of the LED color sources. However, because the temperature of the LED color sources changes during operation, it is advantageous to be able to measure each color source continually. With a fast enough color sensor it is possible to sample all of the color sources then return to the previous intensity levels faster than the human eye can detect.

Realtime Color Sensor Sampling

As mentioned above it is advantageous to measure LED color sources continually during operation to compensate for changes in temperature. Trying to sample the color sources all at once during operation as described above increases likelihood that the light source will appear to flicker. Even if the system is run fast enough that there is no perception of flicker these sampling periods will affect the perceived output color.

Figure 8B:
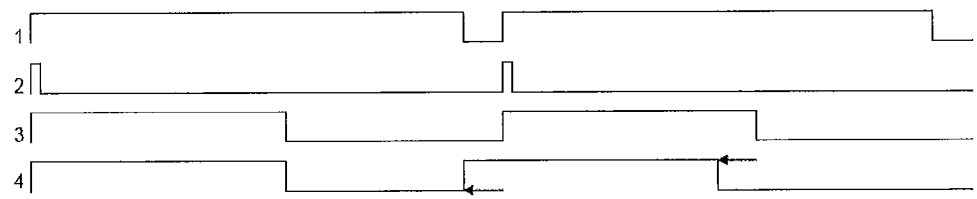

FIGS. 8A-8B illustrate pulse width modulation signals for color sources and the manipulation of these signals to enable color sensor sampling, according to various embodiments. A small amount of time is reserved for sensor sampling at the end of each pulse width modulation cycle. By setting a maximum duty cycle of less than 100%, there will always be a period of time when all color sources are turned off. For an example, FIG. 8A shows four pulses, the longest of which is set to a 92% duty cycle. By using a maximum duty cycle of 92%, the remaining 8% of the cycle time can be used for taking samples. The maximum duty cycle could be higher or lower than 92% depending on how much time is needed for taking samples, and how much of the brightness is considered an acceptable trade off for improved accuracy.

FIG. 8B shows how color source 4 could be sampled without changing the output color. Color source 4 is turned on early, at the point where all the other sources are guaranteed to be turned off. Then there is a brief window to sample color source 4, before the other three sources are turned on again. Color source 4 is then turned off early during the follow cycle so that it still produces the same average intensity of light.

Color sources 1 and 3 can be sampled in the same way. Also dark samples can be easily taken by not shifting any of the color sources as shown in FIG. 8. However, if a color source is set to a very low duty cycle like color source 2, it is not on for long enough to get the full sampling period. Although when a color source is at such a low duty cycle it is as important to accurately measure it, since it has an equally low impact of the output color.

By sampling one color source per cycle, all of the color sources can be sampled in four cycles. A dark sample or multiple dark samples can be taken. Then, these measurements can then be used to recalculate the mix of color sources. This procedure can be repeated continuously without affecting the output color. Also there is almost no effect on the perception of flicker because there is only a slight shift in the cycles.

Lighting System

Figure 9:
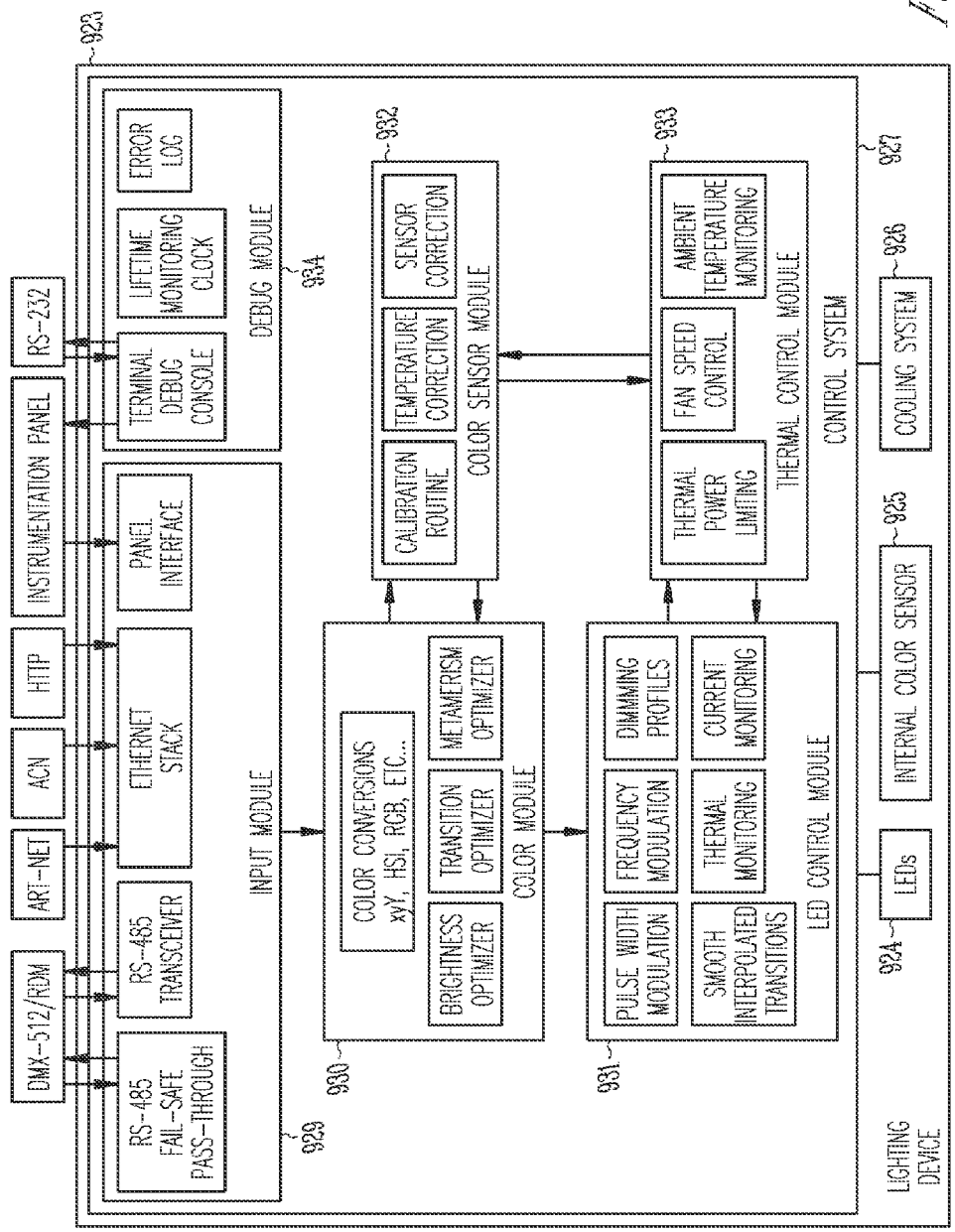
FIG. 9 illustrates an LED lighting system, according to various embodiments of the present subject matter.

FIG. 9 illustrates an LED lighting system, according to various embodiments of the present subject matter. The illustrated system includes a lighting device 923 with LEDs 924, and internal color sensor 925, a cooling system 926, a control system 927 and an external color sensor. The illustrated control system includes an input module 929, a color module 930, an LED control module 931, a color sensor module 932, and a thermal control module 933. These modules may be implemented in hardware, software, firmware, or various combinations thereof.

The input module 929 receives commands from a number of input sources. For example, USITT DMX512-A data can be received over an EIA-485 connection and used to change the output color. Data may also be received through RDM as specified by ESTA E1.20, Artistic License's Art-Net, ACN as specified by ANSI E1.17, or standard HTTP through a web browser. The input module 929 maintains a configuration file, which defines how incoming data is processed. In the case of USITT DMX512-A data, the configuration file specifies the starting address, how many channels are received, and how those channels are processed.

The internal configuration file may be updated in a number of ways. RDM, ACN, and Art-Net all contain provisions in their protocols for changing how incoming data is processed. The input module 929 receives these commands and updates the configuration file so that data is processed correctly. A configuration webpage hosted by the input module 929 is another potential method of changing the configuration file. Additionally, some form of external instrumentation panel may be used to set configuration settings. The instrumentation panel may be as simple as DIP switches used to set the starting address, or something more advanced like an LCD display which can be used to configure every detail of the data processing.

When the input module 929, receives data it sends that data to the appropriate color conversion procedure. The data may have been sent as hue and saturation values, as CIE 1931 xy-coordinates, as Adobe 1998 RGB, as sRGB, as a color temperature of white, or as any other color space. The color module 930 converts the data into a standard color space so that the color can be further processed. The color module 930 then uses the chromaticity and relative intensity of the color sources to determine what ratios of the color sources will produce the desired color. When using more the three color sources there are multiple ways to produce the desired color. The color module 930 can have multiple algorithms available, which enable it to optimize the color source ratios to maximize for brightness, smooth transitions, minimum observer metamerism, or maximize color rendering. Which algorithm to use may be specified by the configuration file or selected automatically based on the color that is being made.

When the color module 930 determines what ratio of color sources will produce the desired color it sends this information to the LED control module 931. To create a smooth transition the LED control module 931 interpolates linearly from the previous ratio of color sources to the new ratio. An overall intensity value is also passed in from the color module 930. This overall intensity value transitions linearly with color ratios. However, a change in lumen output does not relate linearly to the human perception of brightness. So the LED control module 931 uses a dimming profile to try to map the overall intensity value to a perceived brightness level. The LED control module 931 may contain many dimming profiles which can be selected between by the configuration file. For example, one dimming profile might map each intensity value to the square of that intensity value, while another may use the cube.

At each transition step the dimming profile is applied to the intensity value. The result is the used to scale the ratio of color sources. These new values are then output by setting the pulse lengths for each LED color source. In addition to using pulse width modulation to change the intensity, the frequency may be modulated at the same time. The frequency may be decreased to increase the resolution of LED color source settings, or it may be increased to reduce the perception of flicker. This change in frequency may be automatically calculated based on the output pulse lengths, or it may be selected by the input data from the input module 929.

The LED control module 931 may also measure the current drawn from the LEDs, the temperature of the LEDs, or the temperatures of the power regulation circuitry for the LEDs. This information is communicated to the thermal control module 933. The thermal control module 933 looks at previous temperatures and determines if the LEDs are getting too hot. If so it may reduce the maximum output power. If this is the case the LED control module 931 will scale down the overall intensity until the power consumption is limited to the new maximum output power.

Some embodiments include the color sensor module 932 to measure chromaticity and intensity of the LED color sources. The color sensor module 932 may consist solely of a calibration routine that is run at startup or on command from the user. In this embodiment the calibration routine is used to correct for the slow change in chromaticity or intensity that occurs over the lifetime of LED color sources. If the color sensor module 932 is capable of real-time, continuous sampling the sensor data for sensor 925 can be used to correct for the changes chromaticity and intensity that occur with changes in LED temperature. Whether samples are taken continuously or not, the color sensor module 932 performs a similar task. After taking samples of each LED color source, a factory-programmed sensor correction is applied to the measurements. These new measurements are then sent to the color module 932 and used to process the next color to be created.

Some embodiments include the thermal control module 933 to manage the system temperature. The thermal control module 933 measures ambient temperature, fan speed, and communicates with the LED control module 931 to determine the temperature of the LEDs. By monitoring this information the thermal control module 933 will increase or decrease the fan speed to keep the temperature from exceeding a maximum safe operating temperature while keeping the fan as quiet as possible. If the temperature is still climbing after setting the fan to maximum speed, the thermal control module 933 will communicate with the LED control module 931 to limit the maximum output power.

Some embodiments include the debug module 934 to assist in debugging errors. If an error occurs it is logged in non-volatile memory. Also a count of how many hours the system has been running is kept in non-volatile memory. Clock and error log information is made available through a serial connection (e.g. RS-232).

The above detailed description is intended to be illustrative, and not restrictive. The scope of the invention should, therefore, be determined with reference to the appended claims, along with the full scope of equivalents to which such claims are legally entitled.

What is claimed is:

1. A system for generating a target chromaticity, comprising:
   at least four color sources, each of the color sources having a chromaticity determined by hue and saturation, each of the color sources having a range of available color source intensities, the at least four color sources including four or more vertex color sources forming vertices of a gamut area having a shape of a convex polygon, the at least four color sources including at least four sets of three color sources to define at least four partially-overlapping, two-dimensional, triangular sub-gamut areas in which each set of three color sources has a corresponding sub-gamut area, the chromaticity for each color source within each of the sets of three color sources forming a vertex of the corresponding sub-gamut area, the target chromaticity being contained within the gamut area and within at least two of the sub-gamut areas; and
   a controller configured to calculate a final solution to form the target chromaticity within the gamut area using the at least four color sources and control the intensities of the at least four color sources to produce the target chromaticity, wherein the controller is configured to:
   select two or more triangular sub-gamut areas from the at least two sub-gamut areas that contain the target chromaticity;
   for each of the selected two or more triangular sub-gamut areas, calculate a corresponding sub-gamut solution for using only the three color sources that form the vertices of the triangular sub-gamut area to produce the target chromaticity, wherein the sub-gamut solutions may be combined to form the target chromaticity using any weighting of the sub-gamut solutions; and determine the final solution to form the target chromaticity using the sub-gamut solutions, the final solution representing a desired weighting of the sub-gamut solutions to optimize a parameter, the final solution using the at least four color sources, wherein in determining the final solution the controller is configured to:

combine the sub-gamut solutions into a system of linear equations that has multiple solutions for producing the target chromaticity using the at least four color sources, each of the multiple solutions representing a different weighting of the sub-gamut solutions; and optimize the parameter for producing the target chromaticity using the system of linear equations, including use an iterative process to vary weightings of the sub-gamut solutions to determine the final solution to form the target chromaticity without changing hue or saturation of the target chromaticity.

2. The system of claim 1, further comprising:
a substrate of high thermal conductivity;
a solid state light emitting device configured to provide the at least four color sources, the device having a die and a connection point to the die with a low thermal resistance, wherein the connection point is in contact with the substrate;
an electric circuit electrically connected to the light emitting device; and
an electrical dielectric separating the electric circuit from the substrate.

3. The system of claim 2, further comprising:
a heat pipe in the substrate positioned to pass below the light emitting device, wherein the heat pipe is configured to dissipate heat away from the light emitting device; and
a cooling system,
wherein:
the heat pipe is configured to dissipate heat away from the substrate proximate to the light emitting device to the cooling system, or
the cooling system has fluid conduits, and fluid in the fluid conduits remove heat away from the substrate proximate to the light emitting device to the cooling system.

4. The system of claim 2, further comprising:
a plurality of solid state light emitting devices, each of the solid state light emitting devices having a die and a connection point to the die with a low thermal resistance, wherein the connection point is in contact with the substrate;
a mixing chamber, wherein the mixing chamber includes an exit aperture, and wherein the solid state light emitting devices are within the mixing chamber and around the exit aperture;
an optical system configured to receive light exiting from the mixing chamber through the exit aperture; and
a plurality of heat pipes arranged to form chords in a shape that circumscribes the exit aperture, wherein the chords are positioned beneath the solid state light emitting devices.

5. The system of claim 1, wherein the controller is configured to provide a brightest possible solution for the target chromaticity without changing hue or saturation of the target chromaticity.

6. The system of claim 1, wherein the controller is configured to provide a solution for the target chromaticity that is chosen to limit maximum power dissipation or intensity of the color sources while providing the brightest possible solution for the target chromaticity without changing hue or saturation of the target chromaticity.

7. The system of claim 1, wherein the controller is configured to:
produce colors whose brightness change smoothly as the target chromaticity is changed; or
produce colors whose metamerism change smoothly as the target chromaticity is changed; or
produce colors whose spectral power distribution change smoothly as the target chromaticity is changed.

8. The system of claim 1, wherein the controller is configured to:
group the color sources into sets of two color sources, and for each set of two color sources calculate a cross-product between a vector formed by chromaticity points for the two color sources and another vector formed between the target chromaticity and one of the two color sources; and
for each of the at least four sets of three color sources use the calculated cross-products to determine if the target chromaticity is within the triangular sub-gamut area whose vertices are formed by the chromaticity for each color source within the set of three color sources.

9. The system of claim 1, wherein:
to calculate the ratio of color source intensities for each selected set of the three color sources to produce the target chromaticity the controller is configured to:
group the color sources into sets of two color sources, and for each set of two color sources calculate a cross-product between a vector formed by chromaticity points for the two color sources and another vector formed between the target chromaticity and one of the two color sources;
for each vector, multiply the cross product of the vector by a chromaticity weighting to determine an intensity value for the color source opposite from the vector; and
use the determined intensity values for all three color sources to determine the intensity ratio for the color sources in the sub-gamut area.

10. The system of claim 1, wherein the controller is configured to use a sensor to optically monitor the color sources.

11. The system of claim 10, wherein the controller is configured to sample each pulse width modulation cycle for each of the at least four color sources.

12. The system of claim 11, wherein the controller is configured to shift a pulse of a signal for one of the color sources without changing a width of the pulse to cause the pulse to occur at a time when there are no other pulses for the other color sources.

13. The system of claim 1, further comprising a cooling system, wherein the controller includes an LED control module to control the LEDs, and a thermal control module configured to control the cooling system and configured to communicate with the LED control module to adjust signals to the LEDs.

14. The system of claim 1, wherein the controller includes a color module configured to determine a ratio of color source intensities for the color sources for each of the selected sets of three color sources to produce the target chromaticity.

15. The system of claim 14, wherein the color module is configured to optimize brightness, or transitions, or metamerism, or spectral power distribution.

16. The system of claim 14, wherein the controller includes a color sensor module configured to sense LED color, and configured to communicate with the color module to account for the sensed LED color in determining the ratio of color source intensities to produce the target chromaticity.

17. A method, comprising:
    determining a solution for a target chromaticity using at least four color sources, each of the color sources have a chromaticity determined by hue and saturation, each of the color sources have a range of available color source intensities, the at least four color sources including four or more vertex color sources forming vertices of a gamut area having a shape of a convex polygon, the at least four color sources including at least four sets of three color sources to define at least four partially-overlapping, two-dimensional, triangular sub-gamut areas in which each set of three color sources has a corresponding sub-gamut area, the chromaticity for each color source within each of the sets of three color sources forming a vertex of the corresponding sub-gamut area, the target chromaticity being contained within the gamut area and within at least two of the sub-gamut areas, wherein determining the solution includes:
        selecting two or more triangular sub-gamut areas from the at least two sub-gamut areas that contain the target chromaticity;
        for each of the selected two or more triangular sub-gamut areas, calculate a corresponding sub-gamut solution for using only the three color sources that form the vertices of the triangular sub-gamut area to produce the target chromaticity, wherein the sub-gamut solutions may be combined to form the target chromaticity using any weighting of the sub-gamut solutions; and
        determining a final solution to form the target chromaticity using the sub-gamut solutions, the final solution representing a desired weighting of the sub-gamut solutions to optimize a parameter, wherein determining the final solution includes:
            combining the sub-gamut solutions into a system of linear equations that has multiple solutions for producing the target chromaticity using the four or more color sources, each of the multiple solutions representing a different weighting of the sub-gamut solutions; and
            optimizing the parameter for producing the target chromaticity using the system of linear equations, including using an iterative process to vary weightings of the sub-gamut solutions to determine the final solution to form the target chromaticity without changing hue or saturation of the target chromaticity; and
    controlling the four or more color sources using the final solution to generate the target chromaticity.

18. The method of claim 17, wherein determining the solution includes calculating a brightest possible solution for the target chromaticity using the four or more color sources without changing hue or saturation of the target chromaticity.

19. The method of claim 17, wherein determining the solution includes calculating a solution for the target chromaticity to limit maximum power dissipation intensity of the color sources while providing the brightest possible solution without changing hue or saturation of the target chromaticity.

20. The method of claim 17, wherein determining the solution includes:
    producing colors whose brightness change smoothly as the target chromaticity is changed; or
    producing colors whose metamerism change smoothly as the target chromaticity is changed; or
    producing colors whose spectral power distribution change smoothly as the target chromaticity is changed.

21. The method of claim 17, further comprising:
    grouping the four or more color sources into sets of two color sources, and for each set of two color sources calculate a cross-product between a vector formed by chromaticity points for the two color sources and another vector formed between the target chromaticity and one of the two color sources; and
    for each of the at least four sets of three color sources use the calculated cross-products to determine if the target chromaticity is within the two-dimensional, triangular sub-gamut area whose vertices are formed by the chromaticity for each color source within the set of three color sources.

22. The method of claim 21, wherein calculating the ratio of color source intensities for the three color sources to produce the target chromaticity includes determining intensity ratios for each set of three source colors where the target color is in the sub-gamut, wherein determining intensity ratios includes:
    grouping the four or more color sources into sets of two color sources, and for each set of two color sources calculating a cross-product between a vector formed by chromaticity points for the two color sources and another vector formed between the target chromaticity and one of the two color sources;
    for each vector, multiplying the cross product of the vector by a chromaticity weighting to determine an intensity value for the color source opposite from the vector; and
    using the determined intensity values for all three color sources to determine the intensity ratio for the color sources in the sub gamut area.

23. The method of claim 21, further comprising optically monitoring the color sources, wherein generating the solution for the target chromaticity using four or more color sources includes applying a correction factor to account for changes in the monitored colored sources.

24. The method of claim 23, wherein optically monitoring the color sources includes sampling pulse width modulation cycles for each of the color sources.

25. The method of claim 17, further comprising monitoring a temperature, and for a high temperature increasing fluid flow to increase cooling or reducing power output to the LEDs.

26. The method of claim 17, further comprising conducting heat from an LED package through a connection point of the LED package to a thermally conductive substrate, wherein the connection point of the LED package is in contact with the thermally conductive substrate.

27. The system of claim 1, wherein the controller is further configured to limit one or more parameters while optimizing another parameter.

28. The system of claim 1, wherein the controller is configured to optimize metamerism without changing the hue or saturation of the target chromaticity.

29. The system of claim 1, wherein the controller is configured to optimize a spectral power distribution without changing the hue or saturation of the target chromaticity.

30. The method of claim 17, further comprising limiting one or more parameters while optimizing another parameter.

31. The method of claim 17, further comprising optimizing metamerism without changing the hue or saturation of the target chromaticity.

32. The system of claim 17, wherein further comprising optimizing a spectral power distribution without changing the hue or saturation of the target chromaticity.

33. A system for generating an in-gamut target chromaticity, comprising:
   at least four color sources which form vertices of a gamut area and can be grouped into at least four sets of three source colors, wherein the chromaticities of the color sources in each set form the vertices of partially-overlapping, two-dimensional, triangular sub-gamut areas, the in-gamut target chromaticity is contained within the gamut area and within at least two of these sub-gamut areas, wherein:
      there exists multiple solutions having differing brightnesses to produce the in-gamut target chromaticity,
      there is a sub-gamut solution for creating the in-gamut target chromaticity for each sub-gamut area that contains the in-gamut target chromaticity, and
      sub-gamut solutions may be combined to form the target chromaticity using any weighting of the sub-gamut solutions; and
   a controller configured to:
      identify an optimized weighting of sub-gamut solutions that provides a brightest solution for forming the target chromaticity using the at least four color sources;
      combine the sub-gamut solutions using the optimized weighting to provide the brightest solution; and
      control intensities of the at least four color sources to produce the target chromaticity using the brightest solution that does not change hue or saturation of the in-gamut target chromaticity.

34. The system of claim 33, wherein the controller is further configured to limit the maximum power dissipation of the color sources while maximizing the brightness.

35. The system of claim 33, wherein the controller is further configured to limit an ON time of the at least four color sources while maximizing the brightness.

36. The system of claim 33, wherein the controller is configured to group the at least four color sources into sets of two color sources, and for each set of two color sources calculate a cross-product between a vector formed by chromaticity points for the two color sources and another vector formed between the target chromaticity and one of the two color sources; and
   for each of the at least four sets of three color sources use the calculated cross-products to determine if the target chromaticity is within the two-dimensional, triangular sub-gamut area whose vertices are formed by the chromaticity for each color source within the set of three color sources.

37. The system of claim 33, wherein:
to calculate the ratio of intensities of the at least four color sources the controller is configured to:
   group the that at least four color sources into sets of two color sources, and for each set of two color sources calculate a cross-product between a vector formed by chromaticity points for the two color sources and another vector formed between the target chromaticity and one of the two color sources;
   for each vector in each of the sub-gamut areas containing the target chromaticity, multiply the cross product of the vector by a chromaticity weighting to determine an intensity value for the color source opposite from the vector; and
   for each of the sub-gamut areas containing the target chromaticity use the determined intensity values for all three color sources to determine the intensity ratio for the color sources in the sub-gamut area.

* * * * *